(12) United States Patent
Gau et al.

(10) Patent No.: US 7,091,502 B2
(45) Date of Patent: Aug. 15, 2006

(54) APPARATUS AND METHOD FOR IMMERSION LITHOGRAPHY

(75) Inventors: Tsai Sheng Gau, Hsinchu (TW); Chun-Kuang Chen, Chung-li (TW); Ru-Gun Liu, Yongkang (TW); Burn Jeng Lin, Hsinchu (TW)

(73) Assignee: Taiwan Semiconductor Manufacturing, Co., Ltd., Taiwan (CN)

( * ) Notice: Subject to any disclaimer, the term of this patent is extended or adjusted under 35 U.S.C. 154(b) by 176 days.

(21) Appl. No.: 10/844,178

(22) Filed: May 12, 2004

(65) Prior Publication Data

US 2005/0253090 A1  Nov. 17, 2005

(51) Int. Cl.
*H01L 21/027* (2006.01)
*G03F 7/20* (2006.01)

(52) U.S. Cl. ................................. 250/492.2
(58) Field of Classification Search ............. 250/492.2
See application file for complete search history.

(56) References Cited

U.S. PATENT DOCUMENTS 3,648,587 A * 3/1972 Stevens .................... 355/44
4,480,910 A * 11/1984 Takanashi et al. ............ 355/30
2005/0175940 A1 * 8/2005 Dierichs ..................... 430/322

FOREIGN PATENT DOCUMENTS

JP      2004-320017     * 11/2004

* cited by examiner

*Primary Examiner*—Kiet T. Nguyen
*Assistant Examiner*—Jaames J. Leybourne
(74) *Attorney, Agent, or Firm*—Preston Gates & Ellis LLP

(57) ABSTRACT

An immersion lithography system for semiconductor manufacturing provides a lens assembly that moves relative to a wafer surface and includes a nozzle and drain assembly that is coupled to, and moves along, the lens assembly. The nozzle and drain assemblies may be disposed circumferentially opposite each other about the lens or an annular ring may be provided that surrounds the lens and includes a plurality of selectable alternating nozzles and drains. The nozzle and drain assemblies may rotatably surround the lens. At least a portion of the wafer being patterned is immersed in a liquid provided by the nozzle assembly and a flow direction is controlled by manipulating the nozzle and drain assemblies. Flow direction may be advantageously directed outwardly to reduce particulate contamination.

23 Claims, 4 Drawing Sheets

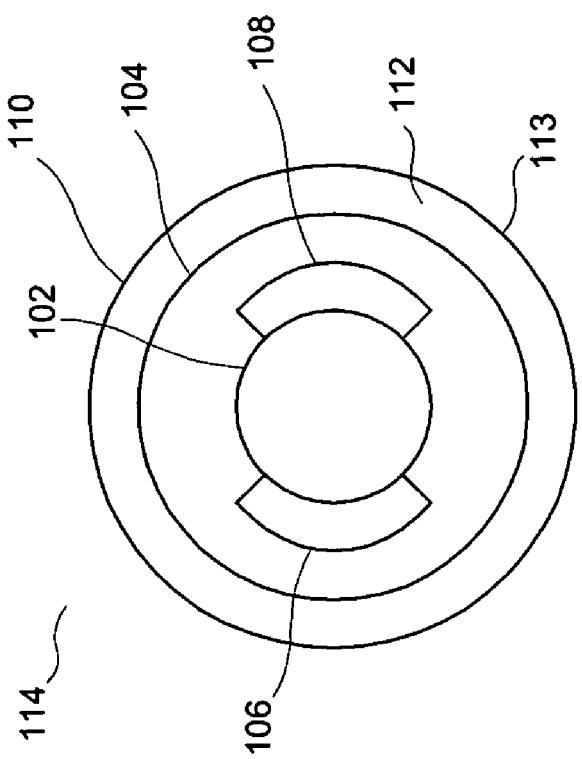
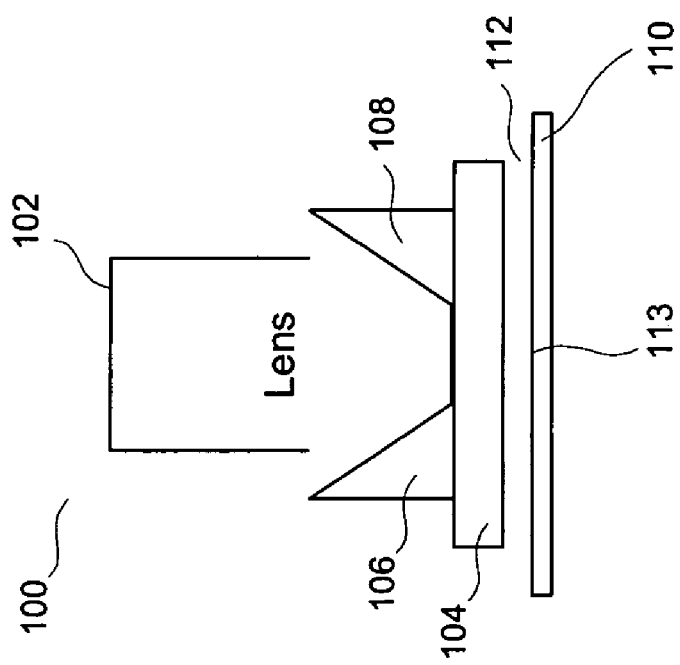
FIG. 1B
FIG. 1A

APPARATUS AND METHOD FOR IMMERSION LITHOGRAPHY

BACKGROUND

The present invention relates generally to lithography in semiconductor processing, and more particularly to an apparatus and method for immersion lithography.

Immersion optics has long been practiced as oil immersion microscopy. Typically, a few drops of oil envelop a high magnification microscope objective and a specimen. The effect is to increase the numerical aperture of the objective. Typically, since the stage and specimen are relatively static, the oil stays in place.

In semiconductor lithography, liquid immersion lithography may produce an effective numerical aperture greater than 1 when a liquid with a refractive index of greater than 1 is introduced between the projection lens and the wafer that is being patterned. A numerical aperture of greater than 1 is achievable because the larger final lens that faces the wafer, projects light into such a liquid rather than air. When a lens projects light into air, internal reflections may undesirably result at the lens-air interface.

Liquid immersion lithography can be useful with 193 nm wavelength exposure light currently in use. It is even more likely to find use with 157 nm, or shorter, wavelength exposure light. At these wavelengths, protective mask pellicles are available. Proven photoresists are also available. The required lenses are not larger or more complicated. An appropriate liquid is required. Since the sequential exposure of multiple sites on a semiconductor wafer using a step-and-repeat photolithography tool is a dynamic event, the stage for the semiconductor wafer will need to handle and contain a flowing liquid.

There are at least two styles of stages. In the bath mode, the wafer surface is always totally immersed. In the shower mode, sufficient fresh fluid flows to immerse, or fill, the space between the lens and the wafer but not necessarily the entire wafer surface at one time. In both styles, the proper handling of the escaping fluid is of great importance. For example, the moving fluid may stir up particulate contamination, a major source of which is at the beveled edge of the wafer. Since this edge is typically formed by grounding the wafer to a rounded shape, it includes a relatively rough surface. Because the processing operation used to grind the wafer is poorly controlled, portions of the rough surface itself and residual materials on and near the rough surface, may easily delaminate in particulate form. The redeposition of these particulate materials on the critical face of the semiconductor wafer is to be avoided.

It would therefore be desirable to provide a suitable immersion lithography system for semiconductor manufacturing. It would also be desirable in the art of immersion lithography, to control the direction of liquid flow, thereby reducing particulate contamination.

SUMMARY

In view of the foregoing, a system and method of immersion lithography is presented which controls the direction of liquid flow, both between the semiconductor wafer and the lens closest to the wafer, and across the surrounding surface of the wafer.

An immersion lithography system for semiconductor manufacturing provides a lens assembly that moves relative to a wafer surface and includes a nozzle and drain assembly that is coupled to, and moves along, the lens assembly. The nozzle and drain assemblies may be disposed circumferentially opposite each other about the lens or an annular ring may be provided that surrounds the lens and includes a plurality of selectable alternating nozzles and drains. The nozzle and drain assemblies may rotatably surround the lens. At least a portion of the wafer being patterned is immersed in a liquid provided by the nozzle assembly and a flow direction is controlled by manipulating the nozzle and drain assemblies. Flow direction are selected so that flow at the edge of the semiconductor wafer is always outward. Loose particulate contamination from the edge of the wafer is therefore always washed outward and off the wafer.

BRIEF DESCRIPTION OF THE DRAWING

The construction and method of operation of the invention, however, together with additional objects and advantages thereof will be best understood from the following description of specific embodiments when read in connection with the accompanying drawings. It is emphasized that, according to common practice, the various features of the drawing are not necessarily to scale. The dimensions of the various features may be arbitrarily expanded or reduced for clarity. Like numerals denote like features throughout the specification and drawing. Included in the drawing are the following figures:

FIGS. 1A and 1B illustrate a lens and rotatable nozzle and drain assemblies in accordance with a first exemplary embodiment of the present invention;

DESCRIPTION

Figure 2:
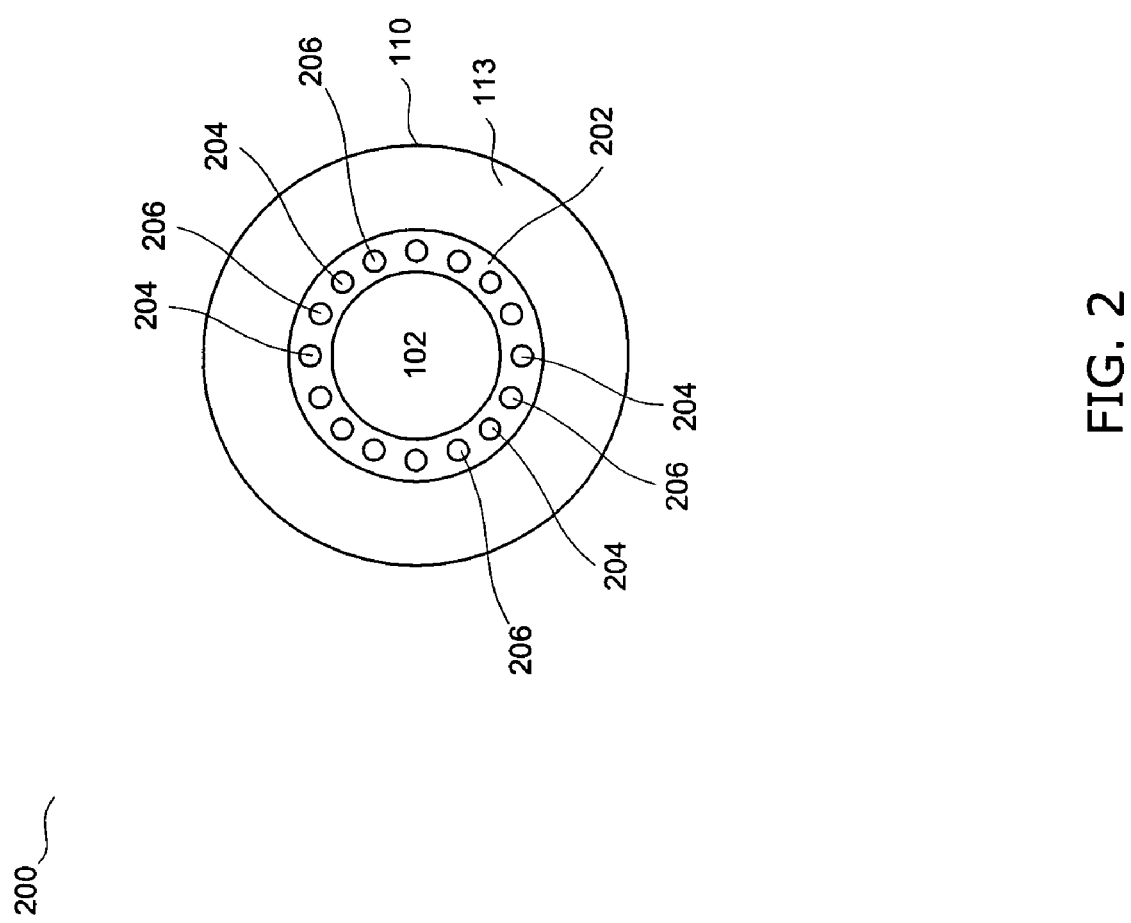
FIG. 2 illustrates an annular plate with selectable, alternating nozzle and drain holes in accordance with a second exemplary embodiment of the present invention.

The present invention provides a system and method of immersion lithography, which controls the flow direction of the majority of liquids involved, both between the last, or ultimate lens and the semiconductor wafer, and also from the lens across the surrounding surface of the wafer, thereby reducing particulate contamination. The "last" lens signifies the lens most proximate, to, and facing, the surface of the wafer being patterned. The liquid is provided between the wafer and lens enabling superior resolution due to an improved numerical aperature of the lens afforded by the presence of the liquid having a refractive index greater than 1. In an advantageous embodiment, the liquid contacts both the lens and the wafer and extends continuously therebetween.

FIG. 1A illustrates a side view 100 of a liquid immersion system for a lens 102 in a photoresist exposure tool for semiconductor manufacturing, in accordance with a first exemplary embodiment of the invention. A base-plate ring 104 encloses and rotates about the bottom end of the lens 102. The base-plate ring 104 carries a nozzle assembly 106 and a drain assembly 108 which, together, may be considered a liquid dispensing apparatus. The nozzle assembly 106 may include a plurality of nozzles and the drain assembly may include a plurality of drains, each capable of withdrawing liquid from surface 113. The horizontal base-plate ring 104 and the bottom of the lens 102 are positioned above and in close proximity to the horizontal face i.e., surface 113 of a semiconductor wafer 110. Such arrangement is exemplary only. The intervening space is filled with liquid 112, which has a refractive index greater than 1 and may be deionized water in some applications, but other fluids that do not attack the surface 113 of semiconductor to wafer 110, may be used in other applications. The liquid 112 will advantageously contact both surface 113 and the bottom of the lens 102 and extend continuously therebetween. The rotatability of base-plate ring 104 enables the direction of liquid flow across wafer 110 to be controlled. It is understood that due to the nature of liquids, the direction control of the liquid flow can only be imposed to achieve the control of the flow direction of the majority of the liquid involved, not every drop of the liquid.

FIG. 1B illustrates a top view 114 of the liquid immersion system for the lens 102 in a photoresist exposure tool for semiconductor manufacturing, in accordance with the first exemplary embodiment shown in FIG. 1A. The base-plate ring 104 encloses and is rotatable about the bottom end of the lens 102. The base-plate ring 104 carries the nozzle assembly 106 and the drain assembly 108 which are disposed adjacent the lens 102 and circumferentially opposite each other about the lens 102. The horizontal base-plate ring 104 and the bottom of the lens 102 are positioned above and in close proximity to the horizontal face of the semiconductor wafer 110. The intervening space is filled with liquid 112, as above.

FIG. 2 illustrates a second exemplary embodiment of the invention. Liquid distribution assembly 200 surrounds lens 102 and includes annular ring 202. The annular ring 202 contains an alternating sequence of selectable nozzles 204 and drains 206. This arrangement allows the flow of liquid to be selected from any particular set of nozzles to any particular set of drains. In this fashion, the direction of the liquid flow can be controlled, both across the face of the lens 102 and away from the annular ring 202 without rotating the annular ring 202. Annular ring 202 may also be rotatable with respect to the lens in another embodiment, providing another way to control the direction of liquid flow across the wafer 110. The flow leaving the annular ring 202. crosses a portion of the semiconductor wafer 110, advantageously the portion being exposed by a light source through lens 102, and thereby patterned. The liquid advantageously contacts both surface 113 and the bottom of the lens 102 and extend continuously therebetween. The arrangement of alternating nozzles 204 and drains 206 is exemplary and other arrangements may be used in other embodiments.

Figure 3:
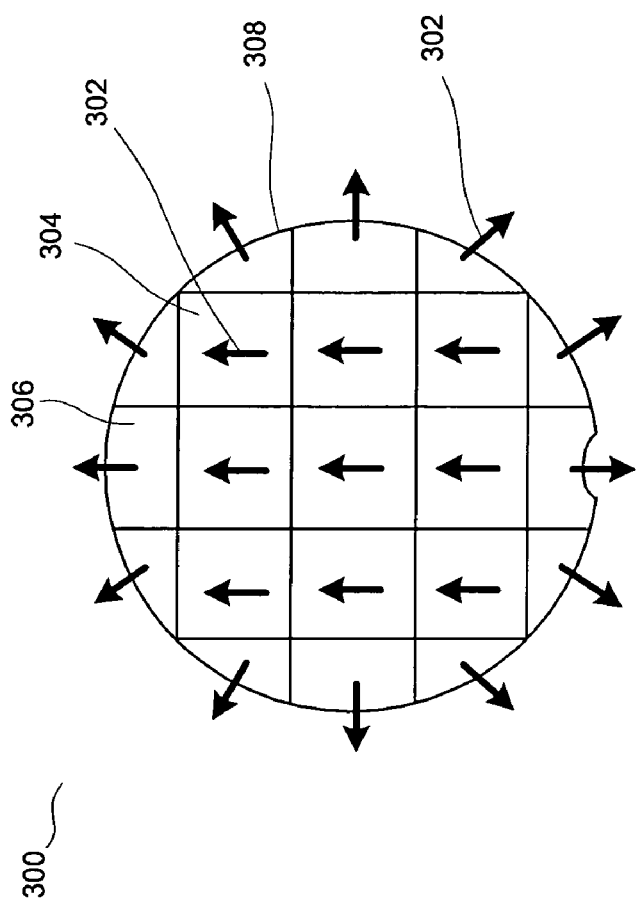
FIG. 3 illustrates the directions, by location, of liquid flow across the surface of the semiconductor wafer in accordance with the first and second exemplary embodiments of the present invention.

FIG. 3 illustrates a flow pattern 300 that is directed by the nozzles and drains of the rotatable base-plate ring 104 in accordance of the first exemplary embodiment of the present invention, or by the nozzles 204 and drains 206 of the annular ring 202 in accordance with the second exemplary embodiment of the present invention. The flow pattern 300 is represented by various flow indicating arrows 302. The indicated flow direction may be in a direction by appropriately rotating the nozzle and drain assemblies of either of the first two exemplary embodiments and/or by activating particular nozzles and drains in the annular ring embodiment.

The purpose of distributed set of nozzles and drains in both the first and the second embodiment of the present invention now becomes apparent. With reference to the first example, as well as FIGS. 1A and 1B, the total apparatus comprising the lens 102, the rotatable liquid dispensing assembly of the base-plate ring 104, the nozzle assembly 106, and the drain assembly 108 is, for instance, about the size of an arbitrary block 304 of a semiconductor wafer 306. The lens 102 and the attached nozzle/drain apparatus are scanned across the surface of the semiconductor wafer 306 in order to sequentially expose a pattern into the photoresist covering the semiconductor wafer 306 such as by a scan-and-repeat lithography tool such as a stepper. In one embodiment the lens and nozzle/drain apparatus together translate essentially parallel to the surface of the semiconductor wafer 306. The flow indicating arrows 302 indicate the liquid flow direction resultant from the action of the selected nozzles and drains, relative to the semiconductor wafer 306. At the peripheral portion of the semiconductor wafer 300, the flow indicating arrows 302 all point outward. Since the most likely source of contaminating particles is an edge 308 of the semiconductor wafer 306, it is advantageous to direct the flow outward. Rather than creating the risk of sweeping particles from the edge 308 back onto the face of the semiconductor wafer 306, the outward flow offers continued cleanliness by sweeping particles toward and over the edge 308 and away from active devices being formed on the interior of semiconductor wafer 306.

Figure 4:
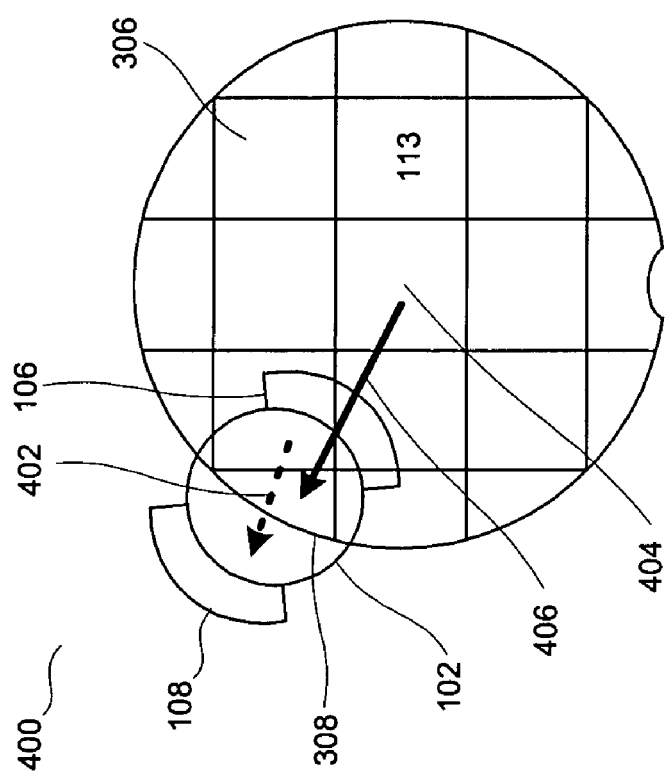
FIG. 4 illustrates the flow direction induced by the lens and nozzle and drain apparatus in accordance with the first exemplary embodiment of the present invention.

FIG. 4 illustrates an exemplary lens position 400 during sequential immersion exposure scanning of the semiconductor wafer 306. The lens 102 carries the nozzle assembly 106 and the drain assembly 108 of the first exemplary embodiment. The nozzles and drains are circumferentially opposed and rotatable about the lens 102 and translate along with the lens 102. The liquid flowing from the nozzles to the drains is always moving in a direction across the face of the lens 102, as shown by a dotted arrow 402, generally away from a center 404 of the semiconductor wafer 306 and toward edge 308 of the semiconductor wafer 306, as shown by a dark arrow 406. Additionally, the lens 102 and liquid dispensing assembly may move generally from the wafer center 404 towards edge 308 in one embodiment. Lens 102 and the nozzle assembly are translatable with respect to surface 113 of the semiconductor wafer 110 and may translate substantially parallel to surface 113. Any contaminating particles dislodged from the surface of the semiconductor wafer 306 or from the edge 308 of the semiconductor wafer 306 will be urged towards and over the edge 308.

Even though this apparatus and method advantageously provide a shower mode liquid immersion exposure tool, it is understood by those skilled in the art that the present invention may be used to provide shower or bath mode liquid immersion in a lithography tool that includes a suitable light source projectable through the lens for patterning a semiconductor device formed on the wafer.

The invention provides many different embodiments or examples for implementing different features of the disclosure. Specific examples of components and processes are described to help clarify the disclosure. These are, of course, merely examples and are not intended to limit the invention from that described in the claims.

Although the invention is illustrated and described herein as embodied in a design and method for, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the disclosure, as set forth in the following claims.

What is claimed is:

1. A photolithography tool for use in manufacturing semiconductor devices, the tool comprising a wafer stage, a lens, and a liquid dispensing assembly coupled to the lens and introducing liquid between a surface of a semiconductor wafer disposed on the wafer stage, and the lens, along a direction away from the semiconductor wafer at its edge.

2. The photolithography tool as in claim 1, wherein the liquid dispensing assembly rotatably surrounds the lens.

3. The photolithography tool as claim 1, wherein the direction is away from a center of the wafer.

4. The photolithography tool as in claim 1, wherein the liquid dispensing assembly is translatable together with the lens, with respect to the surface.

5. The photolithography tool as in claim 1, wherein the liquid dispensing assembly introduces the liquid to contact the surface and the lens and to extend continuously therebetween.

6. The photolithography tool as in claim 1, wherein the liquid dispensing assembly includes a nozzle assembly and a drain assembly disposed above the surface, the drain assembly withdrawing the liquid from the surface.

7. The photolithography tool as in claim 1, wherein the liquid dispensing assembly extends circumferentially about the lens, is rotatable about the lens, and includes a nozzle assembly comprising a plurality of nozzles and a drain assembly comprising a plurality of drains, the nozzle assembly and the drain assembly disposed substantially oppositely about the lens.

8. The photolithography tool as in claim 1, wherein the liquid dispensing assembly rotatably surrounds the lens and includes a nozzle assembly and a drain assembly disposed adjacent the lens and extending partially thereabout.

9. The photolithography tool as in claim 1, wherein the liquid dispensing assembly comprises an annular ring surrounding the lens and having a plurality of nozzles and a plurality of drains formed as openings in the annular ring.

10. The photolithography tool as in claim 9, wherein nozzles of the plurality of nozzles and drains of the plurality of drains form an alternating annular pattern in the annular ring.

11. The photolithography tool as in claim 9, wherein the annular ring is rotatably coupled to the lens.

12. The photolithography tool as in claim 1, further comprising a light source that provides light having a wavelength for patterning the semiconductor wafer, through the lens.

13. A method for immersion lithography comprising:
providing a semiconductor wafer and a lens with a liquid dispensing assembly coupled thereto, in a lithography tool;
a nozzle of the dispensing assembly introducing liquid between the semiconductor wafer and the lens along a flow direction; and
controlling the flow direction by manipulating the liquid dispensing assembly,
wherein the introducing comprises directing the liquid along the flow direction away from a center of the semiconductor wafer.

14. The method as in claim 13, further comprising translating the lens together with the liquid dispensing assembly, with respect to the semiconductor wafer.

15. The method as in claim 14, wherein the introducing comprises providing the liquid to a first portion of the semiconductor wafer and further comprising, after the translating, further introducing the liquid to a further location of the semiconductor wafer and along a further flow direction.

16. The method as in claim 13, wherein the liquid dispensing assembly includes a nozzle assembly and a drain assembly and the manipulating comprises rotating the nozzle assembly and the drain assembly about the lens.

17. The method as in claim 13, wherein the liquid dispensing assembly comprises an annular ring surrounding the lens and includes a plurality of nozzles and a plurality of drains and the manipulating comprises selectively activating nozzles and drains of the plurality of nozzles and the plurality of drains, respectively, to control the flow direction.

18. The method as in claim 13, further comprising patterning the semiconductor wafer by exposing the semiconductor wafer with light directed through the lens while the liquid is disposed between the semiconductor wafer and the lens.

19. The method as in claim 13, wherein the introducing includes introducing the liquid to contact the lens and a surface of the semiconductor wafer to extend continuously from the lens to the surface.

20. A photolithography tool for use in manufacturing semiconductor devices, the tool comprising:
a wafer stage;
a lens; and
a liquid dispensing assembly rotatably surrounds the lens and introducing liquid between a surface of a semiconductor wafer disposed on the wafer stage and the lens, along a direction away from the semiconductor wafer at its edge, wherein the liquid dispensing assembly includes a nozzle assembly for dispensing the liquid and a drain assembly for withdrawing the liquid from the surface, the nozzle assembly and drain assembly being disposed substantially oppositely about the lens.

21. The photolithography tool as in claim 20, wherein the liquid dispensing assembly is translatable together with the lens, with respect to the surface.

22. A photolithography tool for use in manufacturing semiconductor devices, the tool comprising:
a wafer stage;
a lens; and
a liquid dispensing assembly extending circumferentially about the lens, having an annular ring surrounding the lens, and having a plurality of nozzles and a plurality of drains formed as openings in the annular ring,
wherein the annular ring is rotatably coupled to the lens.

23. The photolithography tool as in claim 22, wherein nozzles of the plurality of nozzles and drains of the plurality of drains form an alternating annular pattern in the annular ring.

* * * * *